(12) United States Patent
Watanabe et al.

(10) Patent No.: US 9,179,534 B2
(45) Date of Patent: Nov. 3, 2015

(54) EXTREME ULTRAVIOLET LIGHT SOURCE APPARATUS

(71) Applicant: GIGAPHOTON INC., Oyama, Tochigi (JP)

(72) Inventors: Yukio Watanabe, Hiratsuka (JP);
Osamu Wakabayashi, Hiratsuka (JP);
Miwa Igarashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 2 days.

(21) Appl. No.: 14/158,710

(22) Filed: Jan. 17, 2014

(65) Prior Publication Data

US 2014/0131587 A1      May 15, 2014

Related U.S. Application Data

(62) Division of application No. 12/764,517, filed on Apr. 21, 2010, now Pat. No. 8,669,542.

(30) Foreign Application Priority Data

Apr. 23, 2009   (JP) .................................. 2009-105499
Nov. 26, 2009   (JP) .................................. 2009-268548

(51) Int. Cl.
*H05G 2/00* (2006.01)
*G03F 7/20* (2006.01)
*G21K 1/04* (2006.01)

(52) U.S. Cl.
CPC ............ *H05G 2/008* (2013.01); *G03F 7/70033* (2013.01); *G03F 7/70916* (2013.01); *G21K 1/04* (2013.01); *H05G 2/003* (2013.01); *H05G 2/005* (2013.01)

(58) Field of Classification Search
None
See application file for complete search history.

(56) References Cited

U.S. PATENT DOCUMENTS

| 6,031,598 | A | * | 2/2000 | Tichenor et al. | ................. | 355/67 |
| 6,147,818 | A | * | 11/2000 | Hale et al. | ...................... | 359/819 |
| 6,211,947 | B1 | * | 4/2001 | Tsuji | ................................ | 355/67 |
| 6,229,871 | B1 | * | 5/2001 | Tichenor | ......................... | 378/34 |

(Continued)

FOREIGN PATENT DOCUMENTS

| JP | H05-217857 A | 8/1993 |
| JP | 2005-032510 A | 2/2005 |

(Continued)

OTHER PUBLICATIONS

Notice of Reason for Rejection with Full English Translation issued in Japanese Patent Application No. 2010-089478 mailed Dec. 3, 2013.

(Continued)

*Primary Examiner* — Andrew Smyth
(74) *Attorney, Agent, or Firm* — Studebaker & Brackett PC

(57) ABSTRACT

An extreme ultraviolet light source apparatus for supplying extreme ultraviolet light to a processing unit for performing processing by using the extreme ultraviolet light. The extreme ultraviolet light source apparatus includes: a chamber in which the extreme ultraviolet light to be supplied to the processing unit is generated; a collector mirror for collecting the extreme ultraviolet light generated in the chamber to output the extreme ultraviolet light to the processing unit; and an optical path connection module for defining a route of the extreme ultraviolet light between the chamber and the processing unit and isolating the route of the extreme ultraviolet light from outside.

5 Claims, 11 Drawing Sheets

(56) References Cited

U.S. PATENT DOCUMENTS

| | | | |
|---|---|---|---|
| 6,469,827 B1* | 10/2002 | Sweatt et al. | 359/351 |
| 6,542,222 B1* | 4/2003 | Tsuji et al. | 355/67 |
| 6,549,277 B1* | 4/2003 | Narushima et al. | 356/218 |
| 6,603,532 B2* | 8/2003 | Tsuji et al. | 355/66 |
| 6,642,995 B2* | 11/2003 | Sweatt et al. | 355/71 |
| 6,768,567 B2* | 7/2004 | Naulleau | 359/15 |
| 6,781,135 B2* | 8/2004 | Berger | 250/372 |
| 6,798,494 B2* | 9/2004 | Naulleau | 355/67 |
| 6,815,129 B1* | 11/2004 | Bjorkholm et al. | 430/30 |
| 6,859,263 B2* | 2/2005 | Naulleau | 355/67 |
| 6,903,799 B2* | 6/2005 | Tsuji et al. | 355/30 |
| 6,919,951 B2* | 7/2005 | Tsuji | 355/67 |
| 6,927,887 B2* | 8/2005 | Naulleau | 359/15 |
| 6,994,444 B2* | 2/2006 | del Puerto | 359/883 |
| 7,016,030 B2* | 3/2006 | Naulleau | 356/237.2 |
| 7,064,806 B2* | 6/2006 | Tsuji | 355/67 |
| 7,081,992 B2* | 7/2006 | Tichenor et al. | 359/359 |
| 7,110,084 B2* | 9/2006 | Tsuji | 355/53 |
| 7,163,301 B2* | 1/2007 | del Puerto | 359/846 |
| 7,239,443 B2* | 7/2007 | Tichenor et al. | 359/359 |
| 7,251,042 B2* | 7/2007 | Pril | 356/500 |
| 7,264,918 B2* | 9/2007 | Endo et al. | 430/326 |
| 7,271,401 B2 | 9/2007 | Imai et al. | |
| 7,324,187 B2* | 1/2008 | Tsuji et al. | 355/68 |
| 7,372,058 B2* | 5/2008 | Banine et al. | 250/504 R |
| 7,453,645 B2* | 11/2008 | Klunder et al. | 359/634 |
| 7,473,907 B2* | 1/2009 | Singer et al. | 250/492.2 |
| 7,538,856 B2* | 5/2009 | Kajiyama et al. | 355/67 |
| 7,714,987 B2* | 5/2010 | Kajiyama et al. | 355/67 |
| 7,880,153 B2 | 2/2011 | Suganuma et al. | |
| 2002/0048007 A1* | 4/2002 | Tsuji et al. | 355/66 |
| 2002/0101574 A1* | 8/2002 | Tsuji | 355/69 |
| 2003/0031017 A1* | 2/2003 | Tsuji | 362/268 |
| 2003/0043359 A1* | 3/2003 | Naulleau | 355/71 |
| 2003/0058429 A1* | 3/2003 | Schriever | 355/133 |
| 2003/0072046 A1* | 4/2003 | Naulleau | 359/15 |
| 2003/0086068 A1* | 5/2003 | Sweatt et al. | 355/53 |
| 2003/0117596 A1* | 6/2003 | Nishi | 355/51 |
| 2003/0174303 A1* | 9/2003 | Naulleau | 355/71 |
| 2003/0227657 A1* | 12/2003 | Naulleau | 359/15 |
| 2003/0231415 A1* | 12/2003 | Puerto | 359/883 |
| 2004/0046949 A1* | 3/2004 | Ohgushi et al. | 355/53 |
| 2004/0099808 A1* | 5/2004 | Berger | 250/372 |
| 2004/0106068 A1* | 6/2004 | Dierichs | 430/311 |
| 2004/0141164 A1* | 7/2004 | Tsuji et al. | 355/30 |
| 2004/0174505 A1* | 9/2004 | Terashima | 355/30 |
| 2004/0174532 A1* | 9/2004 | Nakauchi | 356/515 |
| 2005/0057737 A1* | 3/2005 | Tsuji | 355/67 |
| 2005/0057738 A1* | 3/2005 | Tsuji | 355/67 |
| 2005/0083515 A1* | 4/2005 | Naulleau | 356/124 |
| 2005/0105290 A1* | 5/2005 | Tsuji | 362/268 |
| 2005/0110972 A1* | 5/2005 | Tsuji et al. | 355/67 |
| 2005/0111080 A1* | 5/2005 | Bakker et al. | 359/350 |
| 2005/0157383 A1* | 7/2005 | Tichenor et al. | 359/359 |
| 2005/0236584 A1* | 10/2005 | Tsuji | 250/492.1 |
| 2005/0254154 A1* | 11/2005 | del Puerto | 359/883 |
| 2005/0274897 A1* | 12/2005 | Singer et al. | 250/372 |
| 2006/0072084 A1* | 4/2006 | Van Herpen et al. | 355/30 |
| 2006/0115771 A1* | 6/2006 | Wilhelmus Van Herpen et al. | 430/311 |
| 2006/0138354 A1* | 6/2006 | Bakker et al. | 250/492.21 |
| 2006/0146413 A1* | 7/2006 | Klunder et al. | 359/634 |
| 2006/0154170 A1* | 7/2006 | Endo et al. | 430/270.1 |
| 2006/0175558 A1* | 8/2006 | Bakker et al. | 250/492.2 |
| 2006/0186356 A1 | 8/2006 | Imai et al. | |
| 2006/0245045 A1* | 11/2006 | Tichenor et al. | 359/359 |
| 2007/0040999 A1* | 2/2007 | Wilhelmus Van Herpen et al. | 355/30 |
| 2007/0069160 A1* | 3/2007 | Banine et al. | 250/504 R |
| 2007/0069162 A1* | 3/2007 | Banine et al. | 250/504 R |
| 2008/0001101 A1* | 1/2008 | Wilhelmus Van Herpen et al. | 250/492.2 |
| 2008/0011967 A1* | 1/2008 | Van Herpen et al. | 250/492.2 |
| 2008/0088814 A1* | 4/2008 | Kajiyama et al. | 355/71 |
| 2008/0179548 A1* | 7/2008 | Bykanov et al. | 250/504 R |
| 2008/0210889 A1* | 9/2008 | Suganuma et al. | 250/504 R |
| 2008/0266650 A1* | 10/2008 | Sasian | 359/351 |
| 2009/0027641 A1* | 1/2009 | Kajiyama et al. | 355/53 |
| 2009/0074962 A1* | 3/2009 | Wilhelmus Van Herpen et al. | 427/250 |
| 2009/0154642 A1* | 6/2009 | Bykanov et al. | 378/34 |

FOREIGN PATENT DOCUMENTS

| | | |
|---|---|---|
| JP | 2005317611 A | 11/2005 |
| JP | 2006-080255 A | 3/2006 |
| JP | 2006-191090 A | 7/2006 |
| JP | 2007088267 A | 4/2007 |
| JP | 2008-218600 A | 9/2008 |
| JP | 2009021496 A | 1/2009 |

OTHER PUBLICATIONS

Entire Prosecution History of U.S. Appl. No. 12/764,517 filed on Apr. 21, 2010 entitled Extreme Ultraviolet Light Source Apparatus.

* cited by examiner

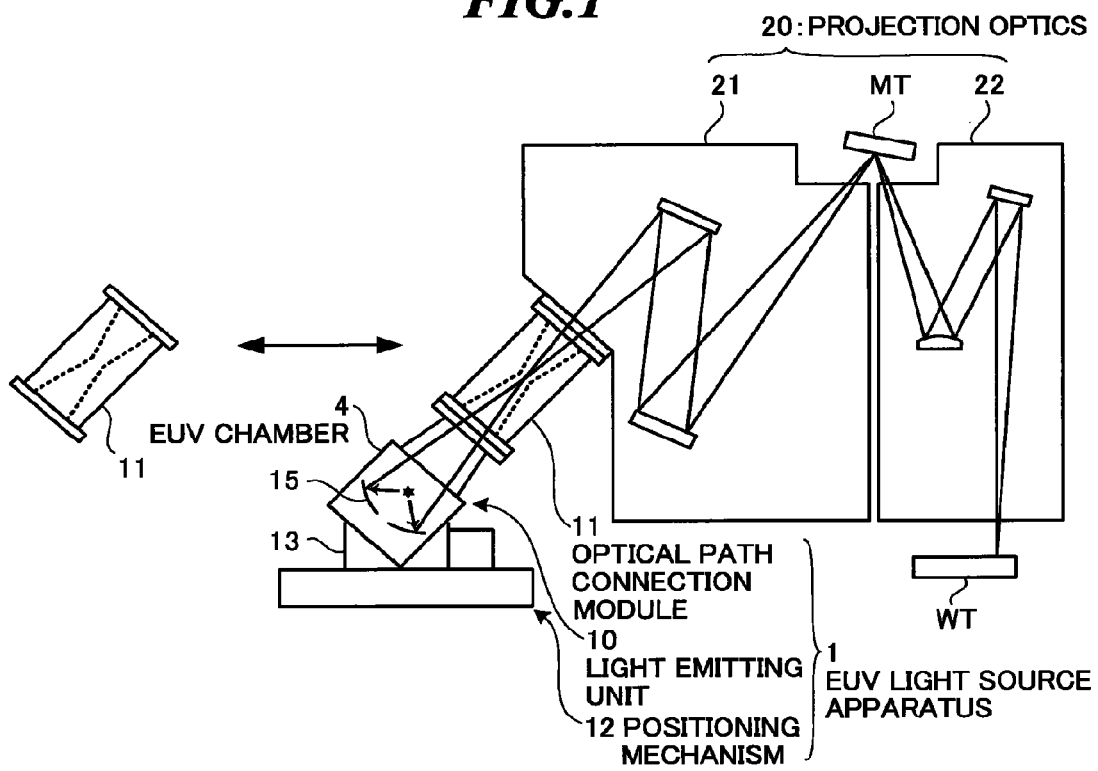
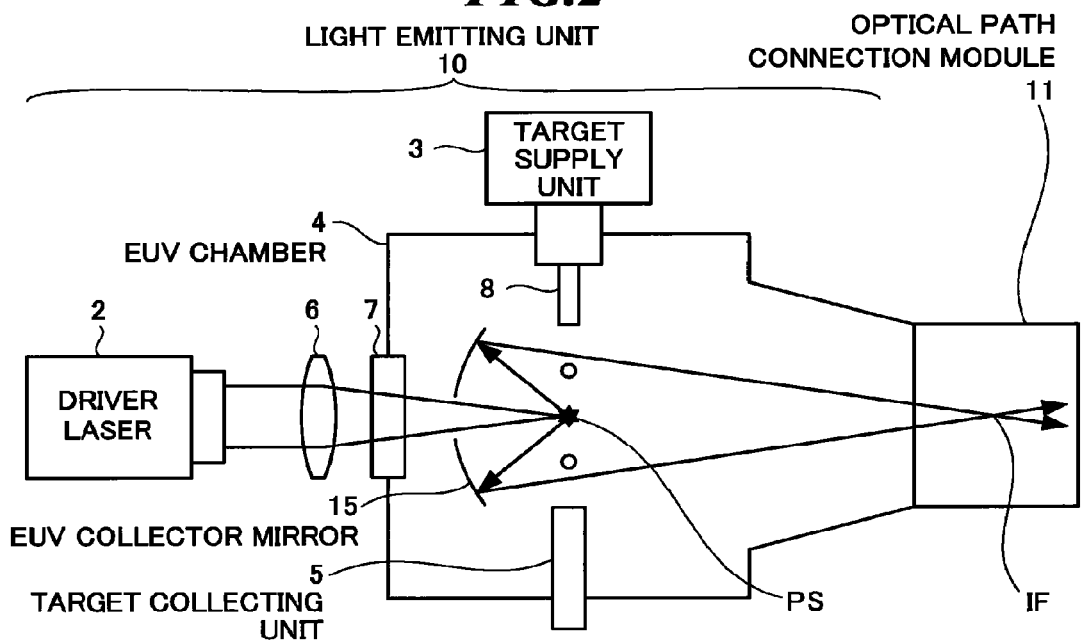

EXTREME ULTRAVIOLET LIGHT SOURCE APPARATUS

CROSS-REFERENCE TO RELATED APPLICATIONS

The present application is a Divisional of U.S. application Ser. No. 12/764,517, filed on Apr. 21, 2010,which claims priority from Japanese Patent Applications No. 2009-105499 filed on Apr. 23, 2009and No. 2009-268548 filed on Nov. 26, 2009, the contents of which are incorporated herein by reference in their entirety.

BACKGROUND OF THE INVENTION

1. Field of the Invention

The present invention relates to an extreme ultraviolet (EUV) light source apparatus to be used in combination with a processing unit for performing processing by using extreme ultraviolet light. For example, the present invention relates to an extreme ultraviolet light source apparatus to be used in combination with projection optics for performing exposure processing of semiconductor wafers in exposure equipment.

2. Description of a Related Art

In recent years, as semiconductor processes become finer, photolithography has been making rapid progress toward finer fabrication. In the next generation, microfabrication at 60 nm to 45 nm, further, microfabrication at 32 nm and beyond will be required. Accordingly, in order to fulfill the requirement for microfabrication at 32 nm and beyond, for example, exposure equipment is expected to be developed by combining an EUV light source for generating EUV light having a wavelength of about 13 nm and reduced projection reflective optics.

As the EUV light source, there are three kinds of light sources, which include an LPP (laser produced plasma) light source using plasma generated by irradiating a target with a laser beam, a DPP (discharge produced plasma) light source using plasma generated by discharge, and an SR (synchrotron radiation) light source using orbital radiation. The EUV light produced by the EUV light source is outputted to a processing unit for performing processing by using EUV light, for example, projection optics of exposure equipment.

As a related technology, U.S. Patent Application Publication US 2006/0146413 A1 discloses an EUV lithographic apparatus in which a radiation unit for radiating EUV light is arranged obliquely to the direction of gravitational force, and thereby, the EUV light is outputted in alignment with an optical axis of an illumination system for illuminating a mask by using the EUV light.

However, specifications of a numerical aperture (NA) and a position of an intermediate focusing point (IF) required for the EUV light source apparatus, an internal pressure necessary for the processing unit for performing processing by using the EUV light, and so on vary depending on the processing units. Accordingly, there is a problem that it may be necessary to change specifications of an EUV chamber according to the specifications of the processing units.

SUMMARY OF THE INVENTION

The present invention has been achieved in view of the above-mentioned problems. A purpose in one aspect of the present invention is to provide an EUV light source apparatus in which changes in specifications of an EUV chamber corresponding to specifications of different processing units can be reduced.

In order to accomplish the above-mentioned purpose, an extreme ultraviolet light source apparatus according to one aspect of the present invention is an extreme ultraviolet light source apparatus for supplying extreme ultraviolet light to a processing unit for performing processing by using the extreme ultraviolet light, including: a chamber in which the extreme ultraviolet light to be supplied to the processing unit is generated; a collector mirror for collecting the extreme ultraviolet light generated in the chamber to output the extreme ultraviolet light to the processing unit; and an optical path connection module for defining a route of the extreme ultraviolet light between the chamber and the processing unit and isolating the route of the extreme ultraviolet light from outside.

According to the one aspect of the present invention, since the optical path connection module is provided between the chamber and the processing unit, the specifications of different processing units can be accepted by changing the optical path connection module, and thereby, changes in the specifications of the EUV chamber can be reduced.

BRIEF DESCRIPTION OF THE DRAWINGS

FIG. 1 is a side view showing a schematic configuration of exposure equipment including an extreme ultraviolet (EUV) light source apparatus according to the first embodiment of the present invention;

FIG. 2 is a schematic diagram showing an outline of a light emitting unit in the EUV light source apparatus as shown in FIG. 1;

DESCRIPTION OF THE PREFERRED EMBODIMENTS

Figure 3A:
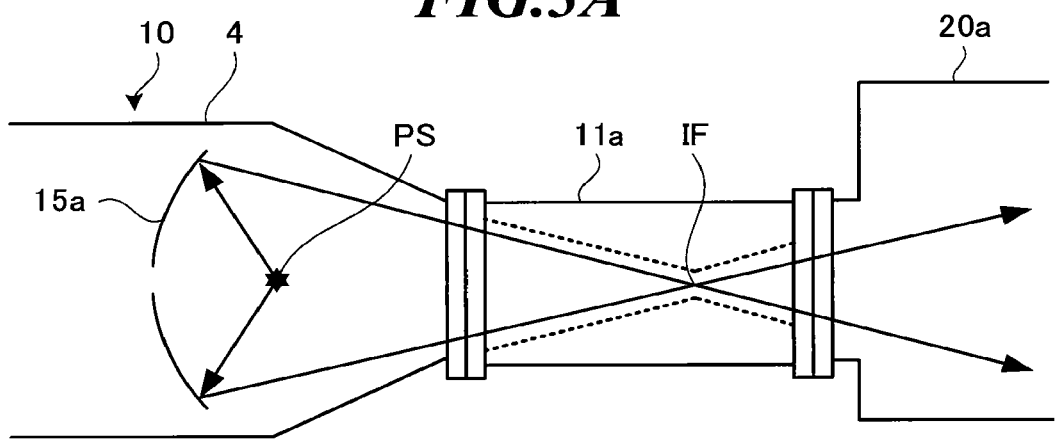
FIGS. 3A-3C are side views showing an EUV light source apparatus according to a first working example.

Hereinafter, preferred embodiments of the present invention will be explained in detail by referring to the drawings. The same reference numerals are assigned to the same component elements and the duplicate explanation thereof will be omitted.

FIG. 1 is a side view showing a schematic configuration of exposure equipment including an extreme ultraviolet (EUV) light source apparatus according to the first embodiment of the present invention. The exposure equipment includes an EUV light source apparatus 1 and projection optics 20. Here, the projection optics 20 is an example of a processing unit for performing processing by using EUV light, and includes a mask irradiation unit 21 as an optics for irradiating a mask with the EUV light, and a workpiece irradiation unit 22 as an optics for projecting a mask pattern on a wafer.

The EUV light source apparatus 1 according to the first embodiment includes a light emitting unit 10 for generating the EUV light, an optical path connection module 11 provided between the light emitting unit 10 and the projection optics 20, and a positioning mechanism 12 for positioning the light emitting unit 10. The light emitting unit 10 employs an LPP (laser produced plasma) system for generating the EUV light by irradiating a target material with a laser beam to excite the target material.

In the LPP system, extremely high intensity close to black body radiation can be obtained because plasma density can be considerably made higher. Further, the light of only particular waveband can be radiated by selecting the target material. Furthermore, an extremely large collection solid angle of $2\pi$ to $4\pi$ steradian can be ensured because it is a point light source having substantially isotropic angle distribution and there is no structure such as electrodes surrounding the light source. From the advantages, the LPP system is considered to be predominant as a light source for EUV lithography, which requires power of more than several tens of watts.

FIG. 2 is a schematic diagram showing an outline of the light emitting unit in the EUV light source apparatus as shown in FIG. 1. The light emitting unit 10 includes a driver laser 2, a target supply unit 3, an EUV chamber 4, a target collecting unit 5, a laser beam focusing optics 6, and an EUV collector mirror 15.

The driver laser 2 is a master oscillator power amplifier type laser source for generating a driving laser beam to be used for exciting the target material. The laser beam generated by the driver laser 2 is focused by the laser beam focusing optics 6 including at least one lens and/or at least one mirror to form a focus on a trajectory (track) of the target material within the EUV chamber 4. When the laser beam is focused and applied onto the target, plasma is generated. The EUV light is emitted from the plasma generation site (PS).

The target supply unit 3 is a unit for supplying the target material such as tin (Sn) or lithium (Li) to be used for generation of the EUV light into the EUV chamber 4 via a target nozzle 8. Among the supplied target materials, those materials which have not been irradiated with the laser beam and which become unnecessary are collected by the target collecting unit 5.

The state of the target material may be a solid, liquid, or gas state, and the target supply unit 3 may supply the target material to a space within the EUV chamber 4 in any known form such as continuous flow (target jet) or droplets. For example, in the case where a molten metal of tin (Sn) is used as the target material, the target supply unit 3 includes a heater for melting tin, a compressed gas cylinder for supplying a high-purity argon (Ar) gas for injecting the molten metal tin, a mass-flow controller, a target nozzle, and so on. Further, in the case where droplets are produced, a vibrating device such as a piezoelectric element is added to the target nozzle 8.

The EUV chamber 4 is a vacuum chamber in which EUV light is generated. To the EUV chamber 4, a window 7 for passing the laser beam generated by the driver laser 2 into the EUV chamber 4 is provided.

The EUV collector mirror 15 is provided within the EUV chamber 4. The EUV collector mirror 15 has a reflection surface coated with a multilayer coating for reflecting EUV light having a specific wavelength at high reflectance. For example, as a collector mirror for collecting EUV light having a wavelength near 13.5 nm, a mirror having a reflection surface on which coatings of molybdenum (Mo) and silicon (Si) are alternatively stacked is used. The reflection surface of the EUV collector mirror 15 has a spheroidal shape, and the EUV collector mirror 15 is arranged such that the first focus of the spheroid is located at the plasma generation site (PS). The EUV light reflected by the EUV collector mirror 15 is collected to the second focus of the spheroid, i.e., an intermediate focusing point (IF).

The target material supplied into the EUV chamber 4 is irradiated with the laser beam, and thereby, plasma is generated. Light having various wavelengths is radiated from the plasma. A specific wavelength component of them (e.g., a component having a wavelength of 13.5 nm) is reflected by the EUV collector mirror 15 at high reflectance. The EUV light outputted from the EUV collector mirror 15 is once focused on the intermediate focusing point (IF) within the optical path connection module 11. Then, the EUV light passes within the optical path connection module 11 as it becomes broader from the intermediate focusing point, and enters the projection optics 20.

By referring to FIG. 1 again, the optical path connection module 11 is provided to define a route of the EUV light between the EUV chamber 4 included in the light emitting unit 10 and the projection optics 20. The optical path connection module 11 is formed in a cylindrical shape for isolating the route of EUV light from outside and passing the EUV light from the end of the EUV chamber 4 to the end of the projection optics 20. The optical path connection module 11 has a shape and a configuration adaptable to the specifications of the projection optics 20, and therefore, changes in the specifications of the projection optics 20 can be accepted by changing the optical path connection module 11, without changes of the EUV chamber 4. The optical path connection module 11 is detachable from one or both of the EUV chamber 4 and the projection optics 20. Here, "detachable" means that the optical path connection module 11 is an independent component separate from the EUV chamber 4, and that the optical path connection module 11 is an independent component separate from the projection optics 20. Under the condition that the EUV chamber 4 and the projection optics 20 are connected to each other via the optical path connection module 11, the optical path connection module 11 air-tightly defines the route of the EUV light between the EUV chamber 4 included in the light emitting unit 10 and the projection optics 20.

The positioning mechanism 12 includes a chamber stage 13 conformed to the shape of the light emitting unit 10. The chamber stage 13 holds the light emitting unit 10 in a posture oblique to the direction of gravity force such that the optical axis of EUV light outputted from the light emitting unit 10 is aligned with the optical axis of the projection optics 20.

The projection optics 20 includes the mask irradiation unit 21 for irradiating a mask with the EUV light, and the workpiece irradiation unit 22 for projecting an image of the mask on a wafer. The mask irradiation unit 21 applies the EUV light entering from the EUV light source apparatus 1 onto a mask pattern of a mask table MT via reflective optics. The workpiece irradiation unit 22 focuses the EUV light reflected from the mask table MT onto a workpiece (semiconductor wafer or the like) on a workpiece table WT via reflective optics. Then, by simultaneously parallel-translating the mask table MT and the workpiece table WT, the mask pattern is transferred to the workpiece.

According to the embodiment, since the optical path connection module 11 is provided between the EUV chamber 4 and the projection optics 20 of the exposure equipment, the specifications of different projection optics can be accepted by changing the optical path connection module 11, and thereby, changes in the specifications of the EUV chamber 4 can be reduced. Therefore, the necessity to respectively design and manufacture the EUV chambers 4 corresponding to specifications of different projection optics can be reduced, and the cost can be reduced.

Here, it is desirable that, in the optical path connection module 11, a section perpendicular to the optical axis of EUV light passing within the optical path connection module 11 is formed in a circular shape (the optical path connection module 11 is formed in a cylindrical shape). However, the present invention is not limited to that, but the section of the optical path connection module 11 may be formed in a rectangular shape or another polygonal shape. Further, the example has been explained in which the driver laser 2 is included in the light emitting unit 10 of the EUV light source apparatus 1. However, the present invention is not limited to that, but the driver laser 2 may be formed as a laser source separate from the EUV light source apparatus 1 and configured to output a laser beam to the EUV light source apparatus 1. Further, the projection optics 20 of the exposure equipment has been exemplified as a processing unit for performing processing by using the EUV light. However, not limited to that, but the processing unit may be a reticle inspection device (mask inspection device), and so on.

Next, specific working examples of the EUV light source apparatus according to the above-mentioned embodiment will be explained. The explanation of the above-mentioned embodiment will be applied to the following working examples unless it goes against its nature.

Figure 3B:
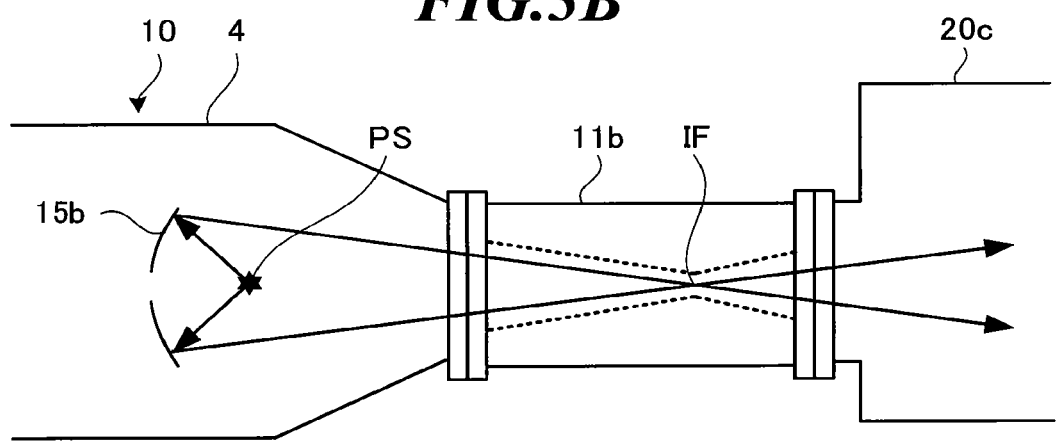
Figure 3C:
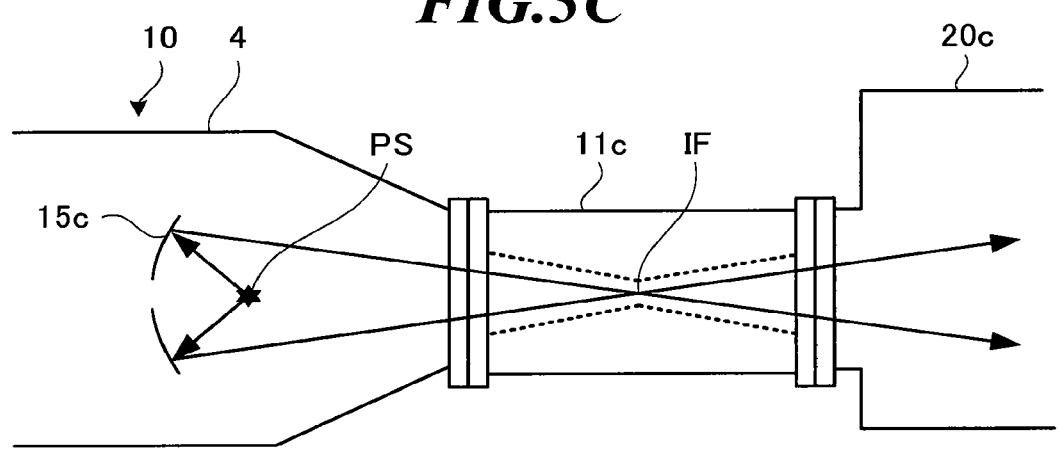

FIGS. 3A-3C are side views showing an EUV light source apparatus according to a first working example. In FIGS. 3A-3C, optical path connection modules 11a, 11b, 11c are enlarged and only apart of the light emitting unit 10 and projection optics 20a, 20b, 20c is shown.

The first working example is, in the case where the projection optics 20a, 20b, 20c require different numerical apertures (NA) or different intermediate focusing points (IF) from one another, to enable coping with the respective specifications by using the light emitting unit 10 including the common EUV chamber 4.

In the case where the projection optics 20a requires the intermediate focusing point (IF) at a position near to the projection optics 20a, the shape of the inner wall of the optical path connection module 11a is formed such that the diaphragm part having the smallest inner diameter is located near to the projection optics 20a, as shown in FIG. 3A.

Further, in the case where the projection optics 20b requires a small numerical aperture (NA), in the inner wall of the optical path connection module 11b, angles open from the position of the intermediate focusing point (IF) toward the ends of the optical path connection module 11b are made smaller as shown in FIG. 3B.

Furthermore, in the case where the projection optics 20c requires the intermediate focusing point (IF) in a position far from the projection optics 20c, the shape of the inner wall of the optical path connection module 11c is formed such that the diaphragm part having the smallest inner diameter is located far from the projection optics 20c, as shown in FIG. 3C.

According to the first working example, changes in the specifications of the EUV chamber 4 can be reduced by changing the optical path connection modules 11a, 11b, 11c and EUV collector mirrors 15a, 15b, 15c in accordance with the specifications of the position of the intermediate focusing point (IF) and the numerical aperture (NA) required by the projection optics 20a, 20b, 20c.

Figure 4A:
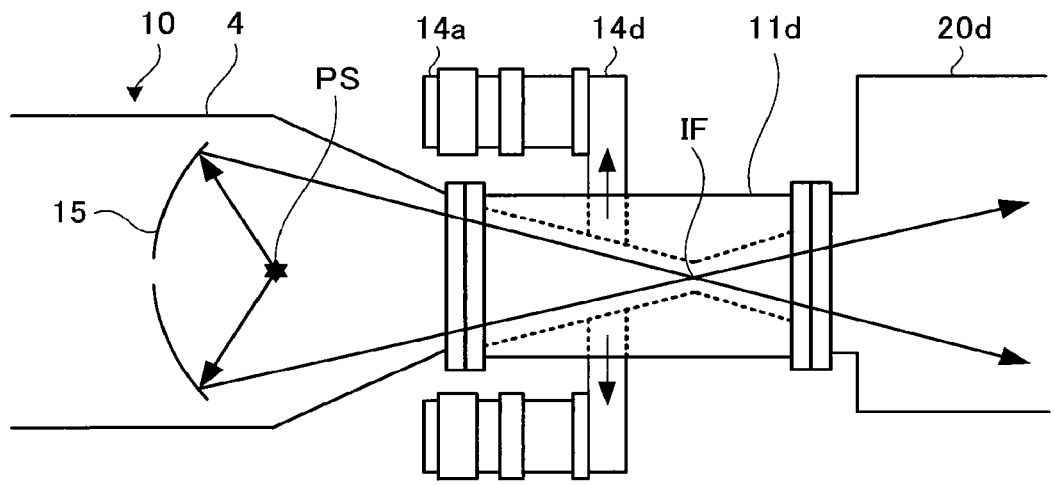
FIGS. 4A-4C are side views showing an EUV light source apparatus according to a second working example.
Figure 4B:
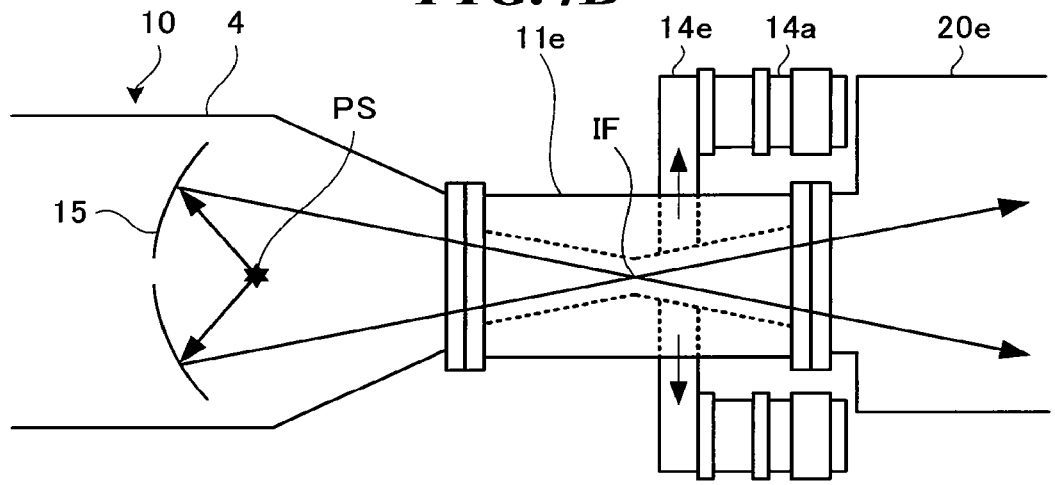
Figure 4C:
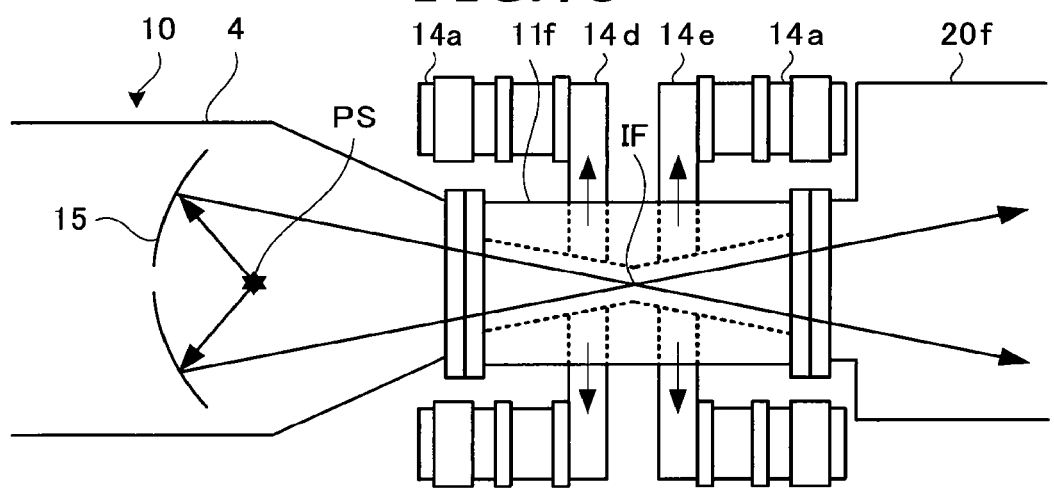

FIGS. 4A-4C are side views showing an EUV light source apparatus according to a second working example. In FIGS. 4A-4C, optical path connection modules 11d, 11e, 11f are enlarged and only a part of the light emitting unit 10 and projection optics 20d, 20e, 20f is shown.

The second working example is, in the case where the projection optics 20d, 20e, 20f require different internal pressure from one another, to enable maintaining differential pressure between the internal pressure of the EUV chamber 4 and the internal pressure of the projection optics 20d, 20e, 20f in accordance with the respective specifications by using the light emitting unit 10 including the common EUV chamber 4.

FIG. 4A shows an example in which an exhaust route 14d on a wall and an evacuation pump 14a connected thereto are provided only at the EUV chamber 4 side seen from the diaphragm part corresponding to the intermediate focusing point (IF) in the optical path connection module 11d. FIG. 4B shows an example in which an exhaust route 14e on a wall and the evacuation pump 14a connected thereto are provided only at the projection optics 20e side seen from the diaphragm part corresponding to the intermediate focusing point (IF) in the optical path connection module 11e. FIG. 4C shows an example in which the exhaust route 14d and the evacuation pump 14a are provided at the EUV chamber 4 side seen from the diaphragm part corresponding to the intermediate focusing point (IF) and the exhaust route 14e and the evacuation pump 14a are also provided at the projection optics 20f side in the optical path connection module 11f.

These examples enable use of the light emitting unit 10 including the common EUV chamber 4 by using the optical path connection modules 11d, 11e, 11f corresponding to respective cases in the case where the EUV chamber 4 side is evacuated, in the case where the projection optics 20d, 20e, 20f sides are evacuated, and in the case where both are evacuated in order to maintain the differential pressure between the internal pressure required by the projection optics 20d, 20e, 20f and the internal pressure required by the EUV chamber 4.

According to the second working example, changes in the specifications of the EUV chamber 4 can be reduced by changing the optical path connection modules 11d, 11e, 11f in accordance with the internal pressure required by the projection optics 20d, 20e, 20f. Therefore, the necessity to respectively design and manufacture the EUV chambers corresponding to the specifications of different projection optics can be reduced, and the cost can be reduced.

In the second working example, similarly to the above-mentioned first working example, the changes in the specifications of the EUV chamber 4 can be further reduced by changing the optical path connection modules 11d, 11e, 11f and EUV collector mirror 15 in accordance with the position of the intermediate focusing point (IF) and the numerical aperture (NA) required by the projection optics 20d, 20e, 20f.

In the second working example, the cases where the evacuation pump 14a is integrated with the optical path connection modules 11d, 11e, 11f have been shown. However, not limited to the working example, in the case where the evacuation pump 14a is larger or the number of the evacuation pumps 14a is larger, the evacuation pump 14a may be separated from the optical path connection modules 11d, 11e, 11f in exhaust paths from the optical path connection modules 11d, 11e, 11f.

Figure 5A:
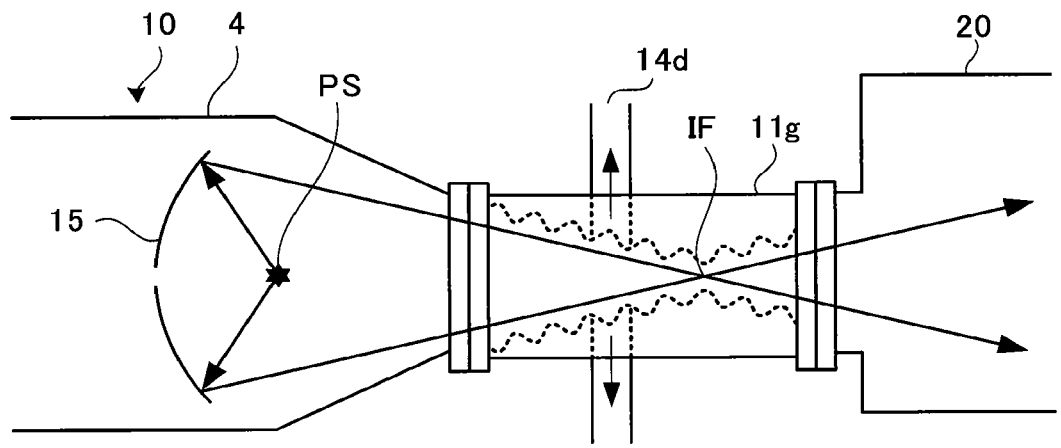
FIGS. 5A and 5B are side views showing an EUV light source apparatus according to a third working example.
Figure 5B:
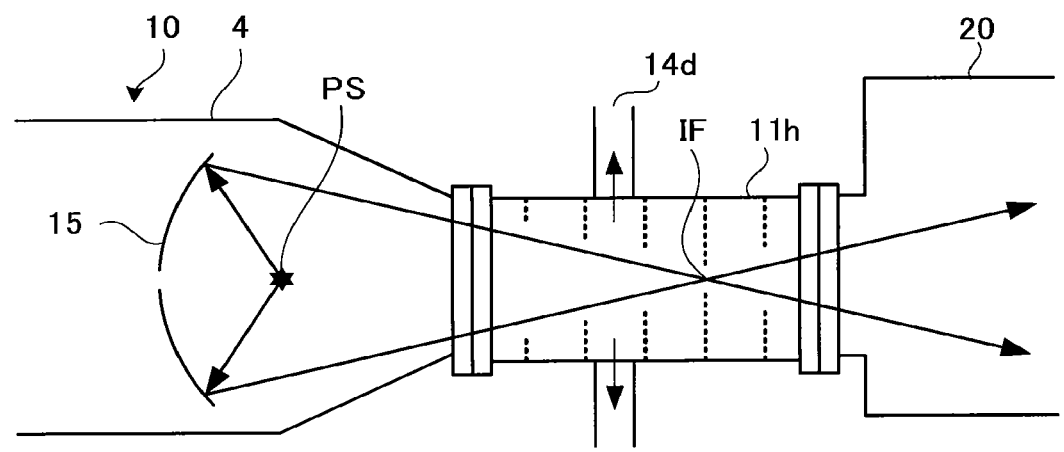

FIGS. 5A and 5B are side views showing an EUV light source apparatus according to a third working example. In FIGS. 5A and 5B, optical path connection modules 11g and 11h are enlarged and only a part of the light emitting unit 10 and the projection optics 20 is shown.

The third working example is, in the above-mentioned first or second working example, the internal wall of the optical path connection module is formed in various shapes.

FIG. 5A shows an example in which the inner wall of the optical path connection module 11g is formed such that the section along the optical axis of EUV light passing within the optical path connection module 11g has a waved shape. FIG. 5B shows an example in which the inner wall of the optical path connection module 11h is formed such that plural perforated flat plates or plural perforated films substantially perpendicular to the optical axis of EUV light passing within the optical path connection module 11h are arranged at respective positions along the optical axis.

In FIGS. 5A and 5B, the diaphragm part having the smallest inner diameter within the optical path connection module 11g or 11h is located at the position of the intermediate focusing point (IF) required by the projection optics 20. Further, the angle of the inner wall of the optical path connection module 11g or 11h opening from the position of the intermediate focusing point (IF) toward the ends of the optical path connection module 11g or 11h is determined in accordance with the numerical aperture (NA) required by the projection optics 20. Furthermore, an exhaust route 14d is provided according to necessity in order to maintain the differential pressure between the inner pressure required by the projection optics 20 and the inner pressure necessary for the EUV chamber 4, and the exhaust route is connected to an evacuation pump.

According to the third working example, debris of the target material generated in the EUV chamber 4 is trapped by the inner wall of the optical path connection module 11g or 11h, and thereby, the debris can be prevented from entering the projection optics 20.

Figure 6:
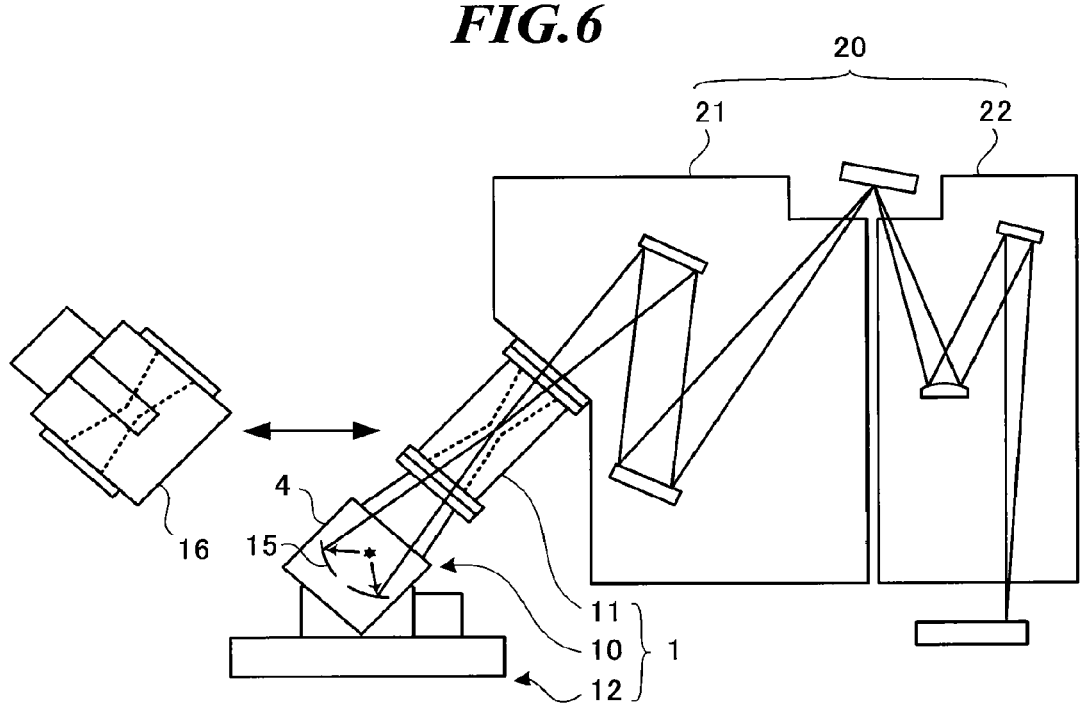
FIG. 6 is a side view showing an EUV light source apparatus according to a fourth working example.

FIG. 6 is a side view showing an EUV light source apparatus according to a fourth working example.

The fourth working example enables detachment of the optical path connection module and attachment of an inspection device 16 for performance test of the light emitting unit 10 into a space formed thereby in the above-mentioned first to third working examples.

According to the fourth working example, the performance test of the light emitting unit 10 can be conducted only by detachment of the optical path connection module 11 from the light emitting unit 10 (including the EUV chamber 4) and the projection optics 20 and attaching the inspection device 16 without moving the light emitting unit 10. Therefore, the necessity of another alignment of the light emitting unit 10 after the test can be reduced, and connection between the light emitting unit 10 and the projection optics 20 can be facilitated.

Figure 7:
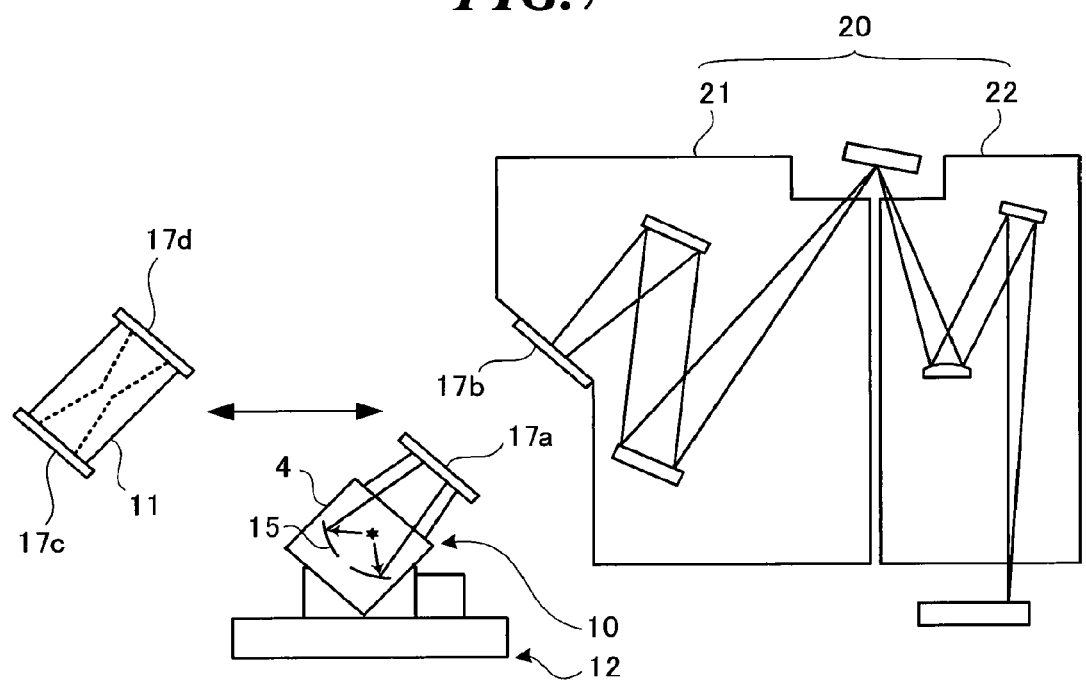
FIG. 7 is a side view showing an EUV light source apparatus according to a fifth working example.

FIG. 7 is a side view showing an EUV light source apparatus according to a fifth working example.

The fifth working example is provided with sealing valves such as gate valves 17a and 17b in the connecting part of the EUV chamber 4 to the optical path connection module 11 and the connecting part of the projection optics 20 to the optical path connection module 11, respectively, in the above-mentioned first to fourth working examples.

According to the fifth working example, when the optical path connection module 11 is detached from the EUV chamber 4, or when the optical path connection module 11 is detached from the projection optics 20, contamination of the interiors of the EUV chamber 4 and the projection optics 20 by air can be suppressed. Further, the gate valves 17c and 17d are also provided at the ends of the optical path connection module 11. As a result, the undermentioned optical components and so on accommodated in the optical path connection module 11 can be protected.

Figure 8A:
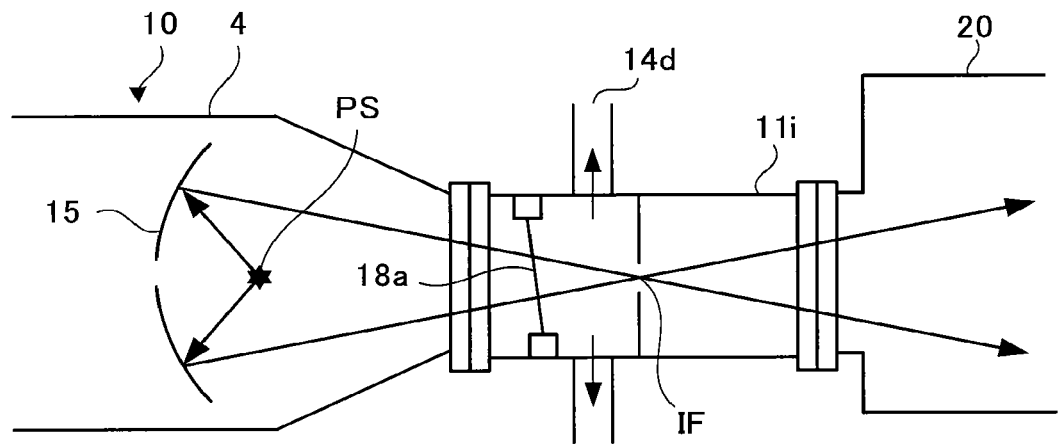
FIGS. 8A and 8B are side views showing an EUV light source apparatus according to a sixth working example.
Figure 8B:
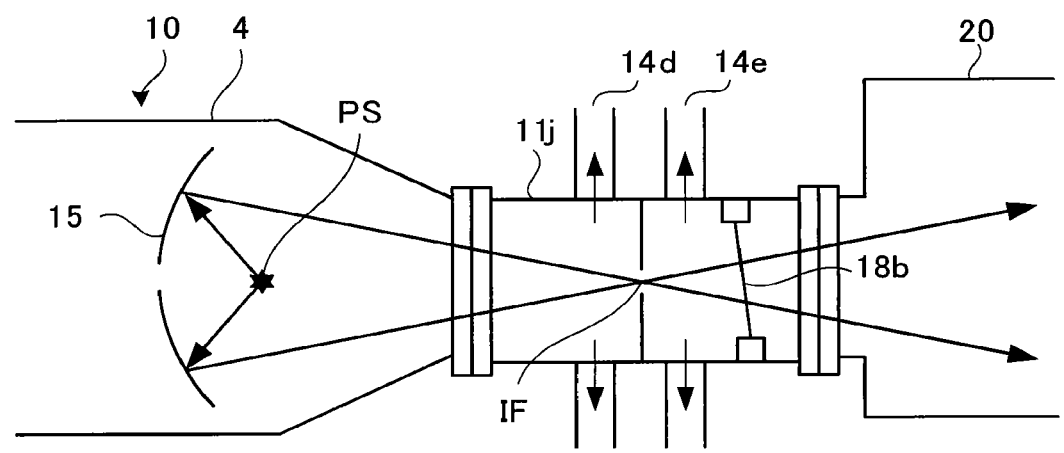

FIGS. 8A and 8B are side views showing an EUV light source apparatus according to a sixth working example. In FIGS. 8A and 8B, optical path connection modules 11i and 11j are enlarged and only a part of the light emitting unit 10 and the projection optics 20 is shown.

The EUV light source apparatus according to the sixth working example includes a spectral purity filter (SPF) 18a or 18b accommodated in the optical path connection module, in the above-mentioned first to fifth working examples. The spectral purity filters 18a and 18b serve to transmit EUV light (for example, EUV light having a wavelength of 13.5 nm) to be used by the projection optics 20 and reflect or absorb light having other wavelengths.

FIG. 8A shows an example in which the exhaust route 14d is provided at the EUV chamber 4 side seen from the diaphragm part provided at the position of the intermediate focusing point (IF) within the optical path connection module 11i, and the spectral purity filter 18a is provided at a position nearer to the EUV chamber 4 than the exhaust route 14d. A zirconium (Zr) thin film is used as the spectral purity filter, and therefore the spectral purity filter may possibly be broken due to the pressure difference between the EUV chamber 4 and the projection optics 20. Accordingly, in the case where pressure P1 in the EUV chamber 4 and pressure P2 in the projection optics 20 have a relation of P1<P2, the optical path connection module 11i is formed as shown in FIG. 8A. Thereby, the space between the diaphragm part located at the position of the intermediate focusing point (IF) and the spectral purity filter 18a is evacuated by the exhaust route 14d, and the breakage of the spectral purity filter 18a can be avoided.

FIG. 8B shows an example in which the exhaust route 14e is provided at the projection optics 20 side seen from the diaphragm part provided at the position of the intermediate focusing point (IF) within the optical path connection module 11j, and the spectral purity filter 18b is provided at a position nearer to the projection optics 20 than the exhaust route 14e. In the case where the pressure P1 in the EUV chamber 4 and the pressure P2 in the projection optics 20 have a relation of P1>P2, the optical path connection module 11j is formed as shown in FIG. 8B. Thereby, the space between the diaphragm part located at the position of the intermediate focusing point (IF) and the spectral purity filter 18b is evacuated by the exhaust route 14e, and the breakage of the spectral purity filter 18b can be avoided.

According to the sixth working example, in the case where the spectral purity filter 18a or 18b requires replacement due to lifetime expiration, the spectral purity filter 18a or 18b can be replaced only by detachment of the optical path connection module 11i or 11j from the light emitting unit 10 (including the EUV chamber 4) and the projection optics 20 without moving the light emitting unit 10. Therefore, the necessity of another alignment of the light emitting unit 10 after the replacement can be reduced, and the light emitting unit 10 and the projection optics 20 can be easily connected.

Figure 9A:
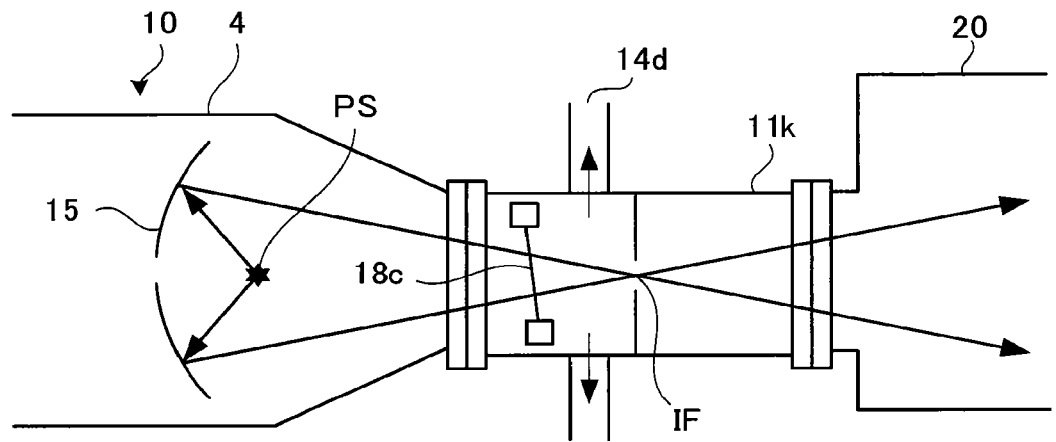
FIGS. 9A and 9B are side views showing an EUV light source apparatus according to a seventh working example.
Figure 9B:
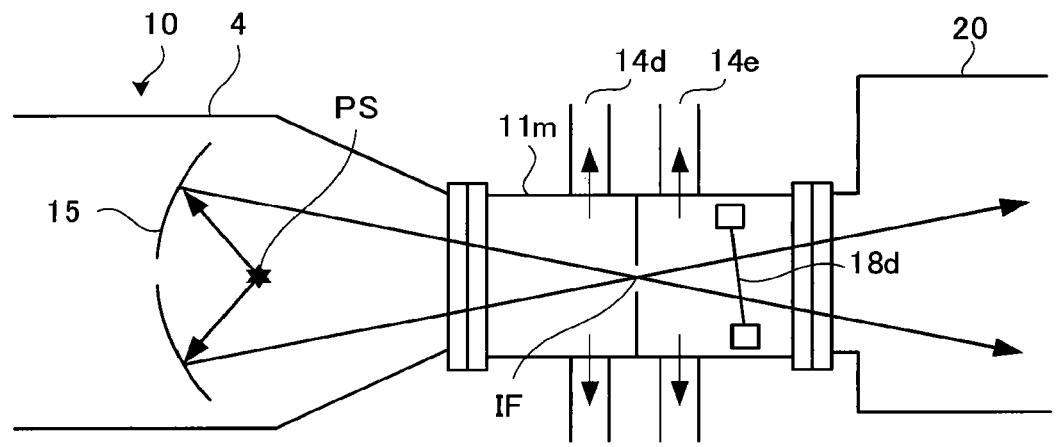

FIGS. 9A and 9B are side views showing an EUV light source apparatus according to a seventh working example. In FIGS. 9A and 9B, optical path connection modules 11k and 11m are enlarged and only a part of the light emitting unit 10 and the projection optics 20 is shown.

The EUV light source apparatus according to the seventh working example is different from the above-mentioned sixth working example in that the inside of the optical path connection modules 11k or 11m is not blocked by a spectral purity filter and a gap is formed between the inner wall of the optical path connection modules 11k or 11m and a spectral purity filter 18c or 18d. In the case where the gap is thus formed within the optical path connection modules 11k or 11m, by evacuation from the exhaust route 14d or 14e, the differential pressure between the EUV chamber 4 and the projection optics 20 can be maintained and debris of the target material generated in the EUV chamber 4 can be prevented from entering the projection optics 20.

According to the seventh working example, in the case where the spectral purity filter 18c or 18d requires replacement due to lifetime expiration, the spectral purity filter 18c or 18d can be replaced only by detachment of the optical path connection module 11k or 11m from the light emitting unit 10 (including the EUV chamber 4) and the projection optics 20 without moving the light emitting unit 10. Therefore, the necessity of another alignment of the light emitting unit 10 after the replacement can be reduced, and the light emitting unit 10 and the projection optics 20 can be easily connected.

Figure 10A:
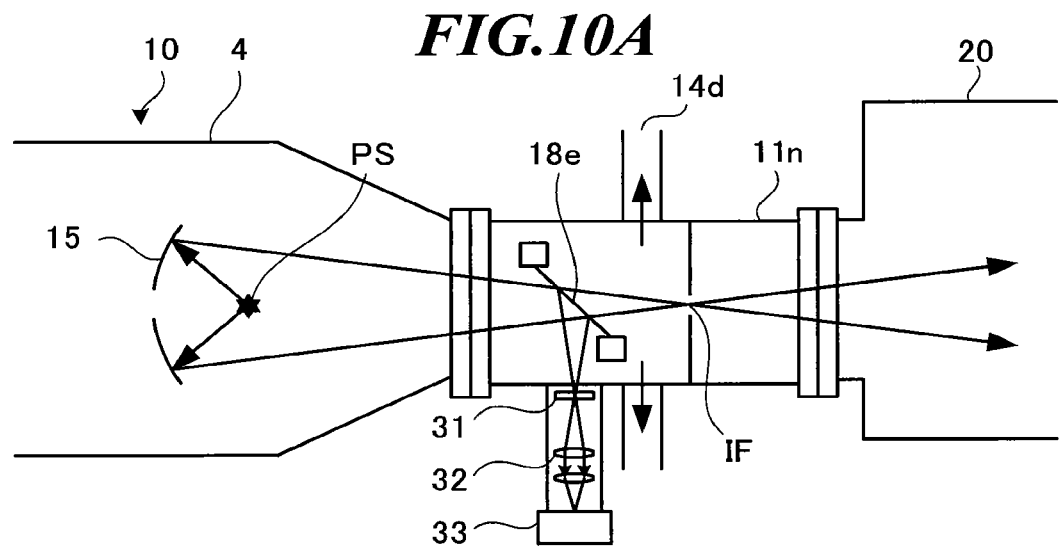
FIGS. 10A-10C are side views showing an EUV light source apparatus according to an eighth working example.
Figure 10B:
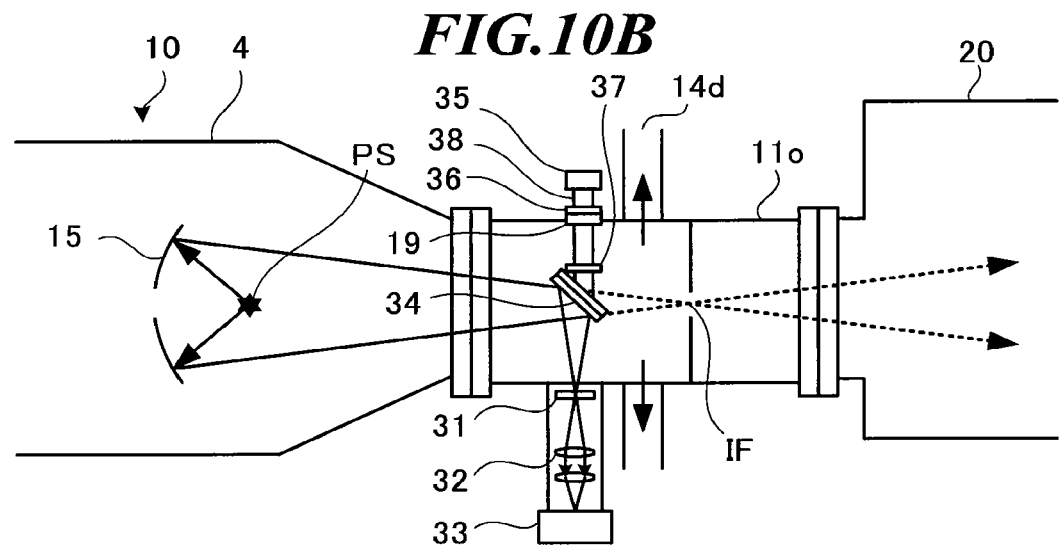
Figure 10C:
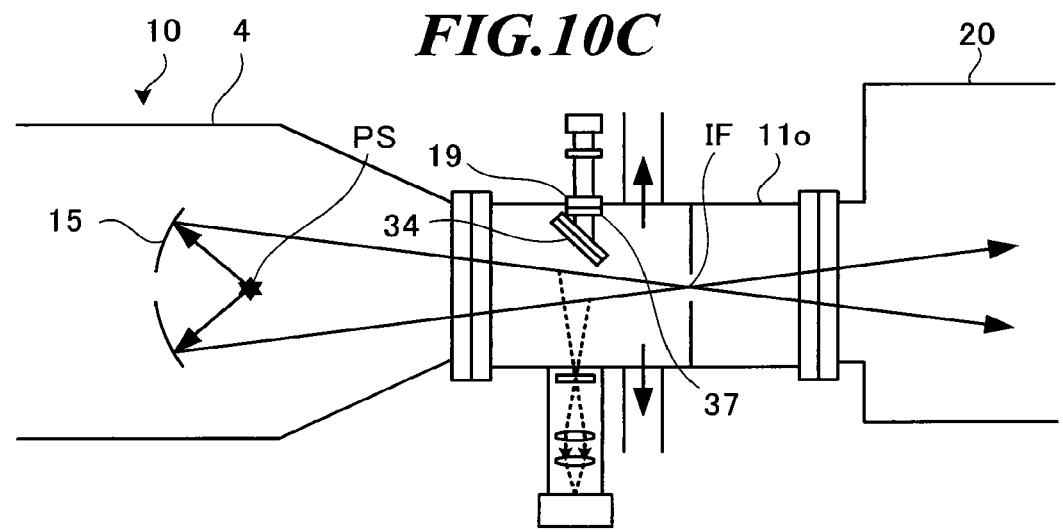

FIGS. 10A-10C are side views showing an EUV light source apparatus according to an eighth working example. In FIGS. 10A and 10B, optical path connection modules 11n and 11o are enlarged and only a part of the light emitting unit 10 and the projection optics 20 is shown.

The EUV light source apparatus according to the eighth working example is provided with an optical element for reflecting light in a position at the EUV chamber 4 side seen from the intermediate focusing point (IF) in the route of EUV light within the optical path connection module and a photodetector for detecting light reflected by the optical element in the route of the reflected light, in the above-mentioned first to fifth working examples. In the eighth working example, a spectral purity filter 18e or a mirror 34 is provided as the optical element for reflecting light, and an intermediate focusing point (IF) detector including a fluorescent screen 31, a transfer optics 32, and a charge coupled device 33 is provided as the photodetector.

In FIG. 10A, the spectral purity filter 18e is provided in the optical path connection module 11n at a tilt angle of about 45 degrees relative to the optical axis of EUV light passing within the optical path connection module 11n. Further, the fluorescent screen 31 is provided on the second focusing point, on which the light reflected by the spectral purity filter 18e is focused, such that the second focusing point is formed on the fluorescent screen 31.

Here, the fluorescent screen 31 is provided in a position at the same optical path distance as an optical path distance to the intermediate focusing point (IF) from the spectral purity filter 18e. When receiving the light reflected by the spectral purity filter 18e, the fluorescent screen 31 emits fluorescence of visible light. The transfer optics 32 transfers and focuses an image of the visible light on the fluorescent screen 31 onto a two-dimensional sensor such as the charge coupled device (CCD) 33. Thereby, the position and shape of the intermediate focusing point (IF) are detected. On the basis of the information, the arrangement of the EUV collector mirror 15 and so on may be controlled to adjust the optical axis of EUV light. On the other hand, the EUV light, that has passed through the spectral purity filter 18e, passes through the intermediate focusing point (IF) within the optical path connection module 11n and is outputted to the projection optics 20.

According to the configuration in FIG. 10A, the position and shape of the intermediate focusing point (IF) can be measured while the EUV light is supplied to the projection optics 20. Here, the example using the spectral purity filter 18e has been explained, but another optical element for transmitting EUV light and reflecting light having other wavelengths may be used.

In FIG. 10B, the mirror 34 is provided in the optical path connection module 11o at a tilt angle of about 45 degrees relative to the optical axis of EUV light passing within the optical path connection module 11o, and the position and focused shape of the intermediate focusing point (IF) are detected by using light reflected by the mirror 34, as is the case in FIG. 10A. The mirror 34 is fixed to a shaft 38 provided with a knob 35, a detection fixing member 36, and a standby fixing member 37, and the shaft 38 can make a reciprocating motion via a seal member 19 fixed to the optical path connection module 11o.

When the intermediate focusing point (IF) is detected, the mirror 34 can be positioned with good reproducibility by bringing the detection fixing member 36 into contact with the seal member 19, as shown in FIG. 10B. On the other hand, when EUV light is outputted to the projection optics 20, the mirror 34 is retracted from the optical path of the EUV light by separating the knob 35 from the wall of the optical path connection module 11o and moving the mirror 34 until the standby fixing member 37 is brought into contact with the seal member 19, as shown in FIG. 10C.

According to the eighth working example, the focus detector (intermediate focusing point (IF) detector) and so on can be replaced only by detachment of the optical path connection module 11n or 11o from the light emitting unit 10 (including the EUV chamber 4) and the projection optics 20 without moving the light emitting unit 10. Therefore, the necessity of another alignment of the light emitting unit 10 after the replacement can be reduced and the light emitting unit 10 and the projection optics 20 can be easily connected.

Figure 11:
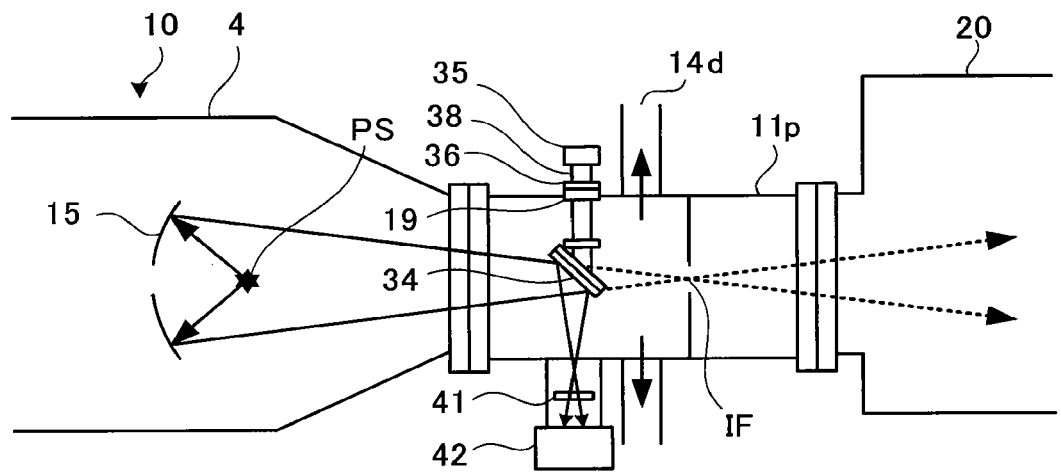
FIG. 11 is a side view showing an EUV light source apparatus according to a ninth working example.

FIG. 11 is a side view showing an EUV light source apparatus according to a ninth working example. In FIG. 11, an optical path connection module 11p is enlarged and only a part of the light emitting unit 10 and the projection optics 20 is shown.

The EUV light source apparatus according to the ninth working example is provided with an optical element for reflecting light such as the mirror 34 in the route of EUV light within the optical path connection module and a photodetector for detecting light reflected by the optical element in the route of the reflected light, in the above-mentioned first to fifth working examples. In the ninth working example, an EUV transmission filter 41 and an energy measuring instrument 42 are provided as the photodetector.

In FIG. 11, the mirror 34, that can make a reciprocating motion similarly to that shown in FIG. 10B, as the optical element for reflecting light is provided within the optical path connection module 11p. The light reflected by the mirror 34 is transmitted through the EUV transmission filter 41 such as a spectral purity filter and enters the energy measuring instrument 42, and the energy of the EUV light is measured. Thereby, calibration of the energy actually outputted to the projection optics 20 and measurement of the energy stability can be performed. The EUV transmission filter 41 is not necessarily provided in the focusing position of EUV light, but may be provided offset into a position, where the EUV transmission filter 41 is not damaged by the EUV light, in the route of the EUV light.

In place of the light reflected by the mirror 34, the light reflected by the spectral purity filter 18e as shown in FIG. 10A may be allowed to directly enter the energy measurement instrument 42 not via the EUV transmission filter 41 and the energy may be measured.

Alternatively, energy E1 of transmitted light under the condition that a CaF$_2$ (calcium fluoride) window is inserted in the route of EUV light in place of the EUV transmission filter 41 and energy E2 of the whole EUV light under the condition that the CaF$_2$ window is retracted outside of the optical path of EUV light may be measured, and the energy of light having a wavelength of 160 nm or less may be obtained by (E2-E1).

According to the ninth working example, the energy measuring instrument 42 and so on can be replaced only by detachment of the optical path connection module lip from the light emitting unit 10 (including the EUV chamber 4) and the projection optics 20 without moving the light emitting unit 10. Therefore, the necessity of another alignment of the light emitting unit 10 after the replacement can be reduced and the light emitting unit 10 and the projection optics 20 can be easily connected.

Figure 12:
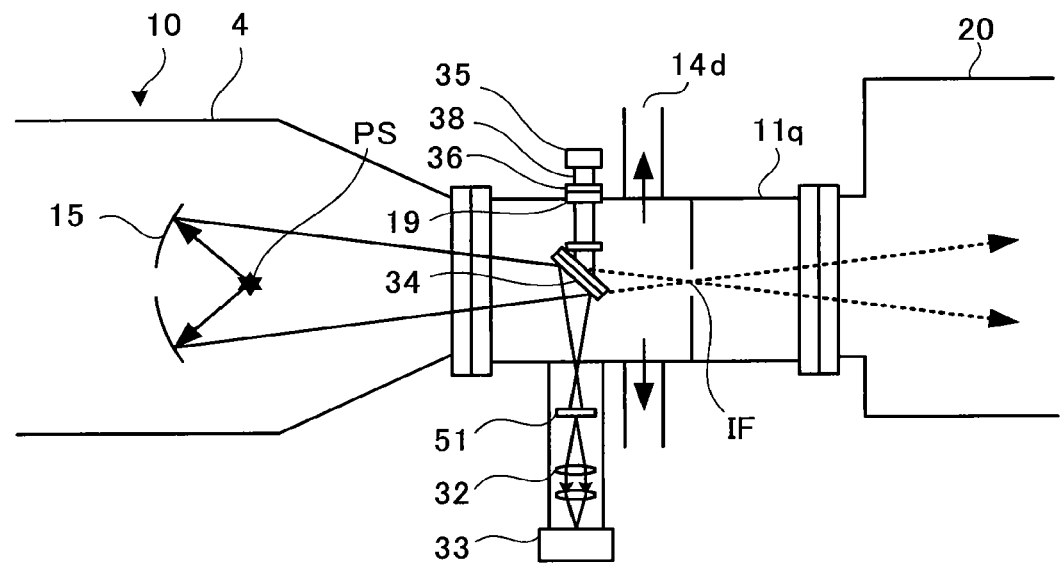
FIG. 12 is a side view showing an EUV light source apparatus according to a tenth working example.

FIG. 12 is a side view showing an EUV light source apparatus according to a tenth working example. In FIG. 12, an optical path connection module 11q is enlarged and only a part of the light emitting unit 10 and the projection optics 20 is shown.

The tenth working example is provided with an optical element for reflecting light, such as the mirror 34, in the route of EUV light within the optical path connection module and with a photodetector for detecting light reflected by the optical element in the route of the reflected light, in the above-mentioned first to fifth working examples. In the tenth working example, a far-field pattern measurement instrument including a fluorescent screen 51, the transfer optics 32, and the charge coupled device 33 is provided as the photodetector.

In FIG. 12, the mirror 34 that can make a reciprocating motion similarly to that shown in FIG. 10B is provided as the optical element for reflecting light within the optical path connection module 11q. The light reflected by the mirror 34 is once focused in front of the fluorescent screen 51. Then, in order that the light after spreading from the focusing point is applied to the fluorescent screen 51, the fluorescent screen 51 is provided at the rear side of the focusing point. Thereby, the beam profile of the far-field pattern of the EUV light to be outputted to the projection optics 20 is measured. By measuring the beam profile of the far-field pattern, a light emission distribution of EUV light can be measured. On the basis of the measurement result, fine adjustment of the light emitting unit 10 such as the ejection timing of the target, the irradiation timing of the target with the laser beam, the position of the target, and the focusing position of the laser beam can be performed such that the light emission distribution of EUV light is uniform.

Alternatively, a beam profile of the far-field pattern may be measured by using the light reflected by the spectral purity filter 18e as shown in FIG. 10A in place of the light reflected by the mirror 34.

According to the tenth working example, the far-field pattern measuring instrument and so on can be replaced only by detachment of the optical path connection module 11q from the light emitting unit 10 (including the EUV chamber 4) and the projection optics 20 without moving the light emitting unit 10. Therefore, the necessity of another alignment of the light emitting unit 10 after the replacement can be reduced, and the light emitting unit 10 and the projection optics 20 can be easily connected.

Figure 13:
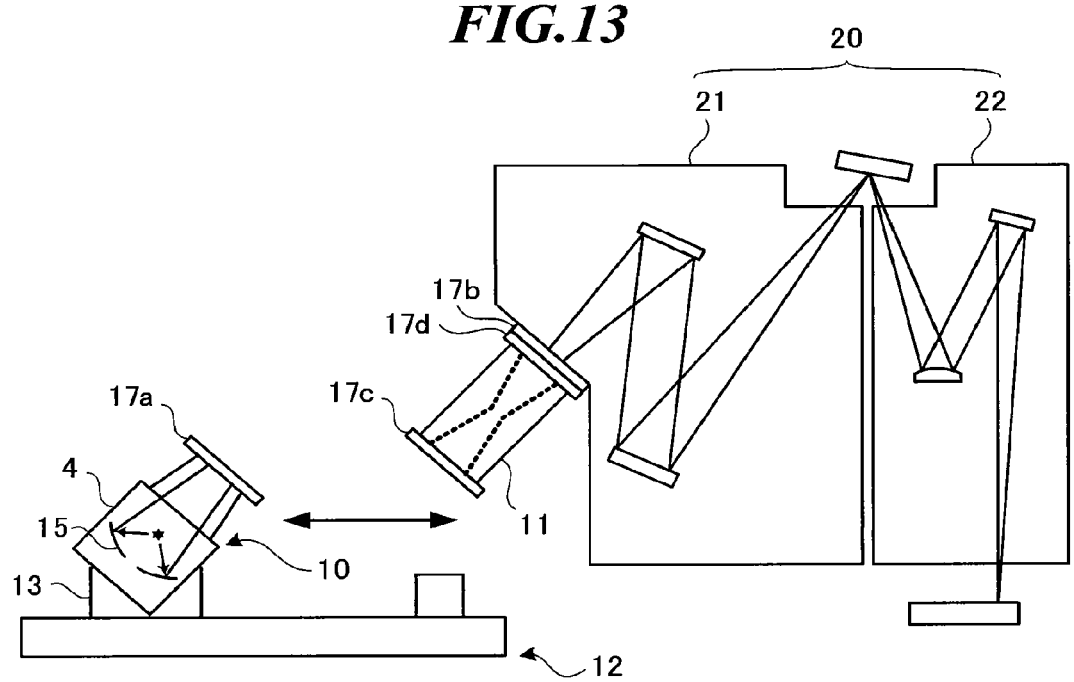
FIG. 13 is a side view showing an EUV light source apparatus according to an eleventh working example.

FIG. 13 is a side view showing an EUV light source apparatus according to an eleventh working example.

The eleventh working example is to enable detachment of the light emitting unit 10 including the EUV chamber 4 from the optical path connection module 11 while the optical path connection module 11 remains connected to the projection optics 20, in the above-mentioned first to tenth working examples.

Since the optical path connection module 11 is designed and manufactured according to the specifications of the projection optics 20, the replacement of the optical path connection module 11 is not necessarily required when the light emitting unit 10 is replaced. Further, in some cases, frequent maintenance is not necessary for the optical elements within the optical path connection module 11 compared to the optical elements within the light emitting unit 10. Furthermore, in other cases, there is no optical element within the optical path connection module 11. The working example enables replacement or maintenance of only the light emitting unit 10 by detachment of the light emitting unit 10 from the optical path connection module 11 while the optical path connection module 11 remains connected to the projection optics 20.

Sealing valves such as gate valves 17a and 17b may be provided in the connecting part of the EUV chamber 4 to the optical path connection module 11 and the connecting part of the projection optics 20 to the optical path connection module 11, respectively. Further, sealing valves such as gate valves 17c and 17d may be provided at the ends of the optical path connection module 11, respectively. In the case where gate valves 17a and 17b are provided, contamination of the interiors of the EUV chamber 4 and the projection optics 20 by air can be suppressed. Further, the optical components and so on accommodated in the optical path connection module 11 can be protected. However, in the case where entrance of air into the EUV chamber 4 or the projection optics 20 is permitted, the gate valve 17a or 17c may be a simple sealing lid in place of the sealing valve that can be opened and closed. Further, in the case where entrance of air into only the optical path connection module 11 is permitted, the gate valve 17a and the gate valve 17b or 17d may be opened and closed at maintenance.

In order to detach the light emitting unit 10, for example, the chamber stage 13 holding the light emitting unit 10 may be moved in the positioning mechanism 12. After replacement or maintenance of the light emitting unit 10 is completed, the chamber stage 13 is positioned in the positioning mechanism 12 in the condition that the light emitting unit 10 is held on the chamber stage 13. Thereby, the light emitting unit 10 is positioned such that the optical axis of EUV light outputted from the light emitting unit 10 is aligned with the optical axis of the projection optics 20.

Figure 14:
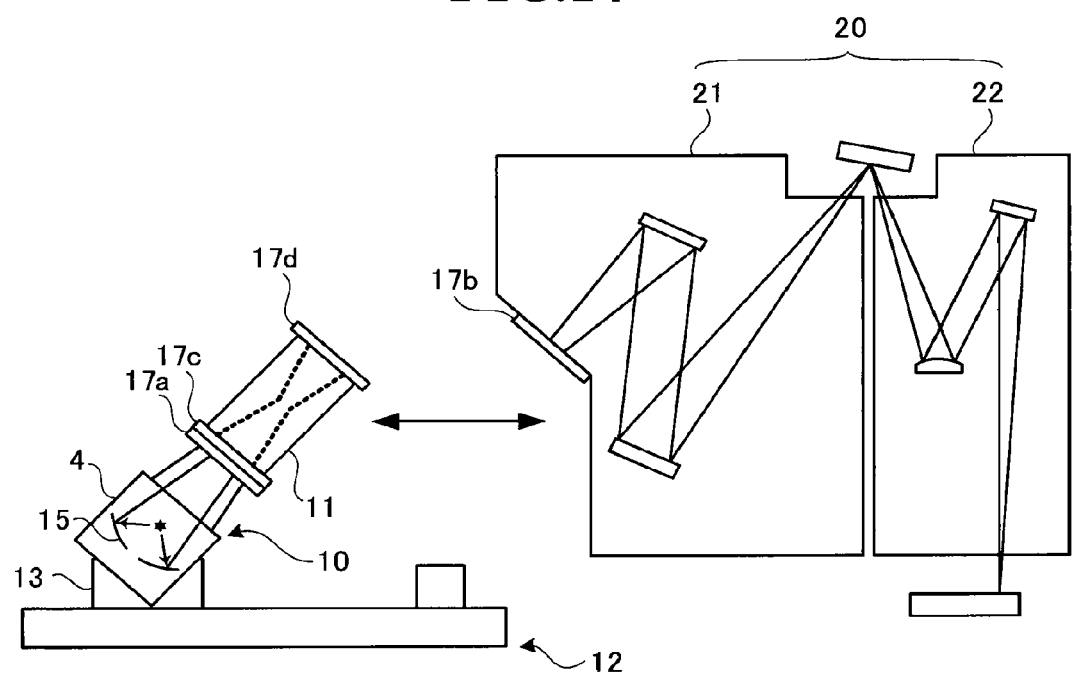
FIG. 14 is a side view showing an EUV light source apparatus according to a twelfth working example.

FIG. 14 is a side view showing an EUV light source apparatus according to a twelfth working example.

The twelfth working example is to enable detachment of the optical path connection module 11 and the light emitting unit 10 from the projection optics 20 while they remain connected to each other, in the above-mentioned first to tenth working examples.

Sealing valves such as gate valves 17a and 17b may be provided in the connecting part of the EUV chamber 4 to the optical path connection module 11 and the connecting part of the projection optics 20 to the optical path connection module 11, respectively. Further, sealing valves such as gate valves 17c and 17d may be provided at the ends of the optical path connection module 11, respectively. In the case where the gate valves 17b and 17d are provided, contamination of the interiors of the EUV chamber 4 and the projection optics 20 by air can be suppressed. Further, the optical components and so on accommodated in the optical path connection module 11 can be protected. Alternatively, in the case where entrance of air into the EUV chamber 4 or the projection optics 20 is permitted, the gate valve 17b or 17d may be a simple sealing lid in place of the sealing valve that can be opened and closed. Further, in the case where entrance of air into only the optical path connection module 11 is permitted, the gate valve 17b and the gate valve 17a or 17c may be opened and closed at maintenance.

As in the working example, with the optical path connection module 11 and the light emitting unit 10 connected to each other, they are detached from the projection optics 20, and thereby, maintenance of the optical path connection module 11 and the light emitting unit 10 can be performed at the same time.

In the above explanation, the target material to be irradiated with the laser beam by the driver laser 2 may include the target material supplied from the target supply unit 3, and additionally, may include a target material turned into a vaporized or plasma state by irradiation with a pre-pulse laser beam of a known pre-pulse laser.

Although the projection optics 20 is also shown in the drawings in the explanation of the present invention, that is for explanation of the light emitting unit 10 and the optical path connection module 11 included in the EUV light source apparatus 1, and the inventors have no intention that the EUV light source apparatus 1 includes the projection optics 20 of the exposure equipment.

Next, the second embodiment will be explained.

Figure 15:
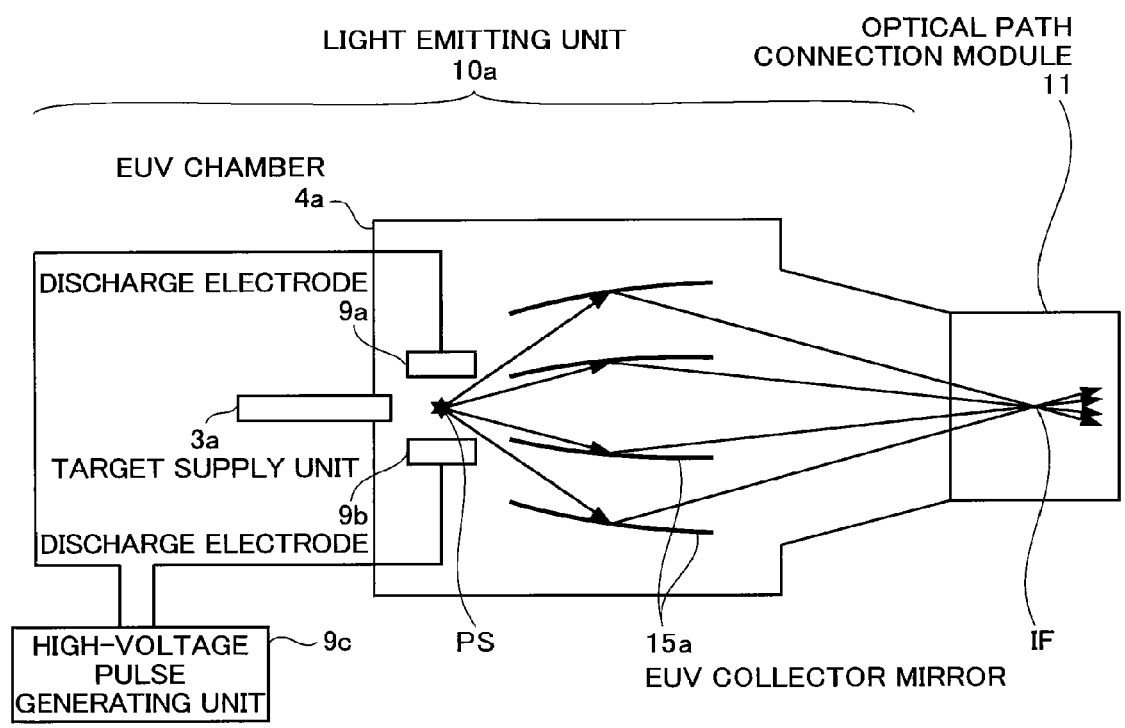
FIG. 15 is a schematic diagram showing an outline of a light emitting unit in an EUV light source apparatus according to the second embodiment of the invention.

FIG. 15 is a schematic diagram showing an outline of a light emitting unit in an EUV light source apparatus according to the second embodiment of the invention. The light emitting unit 10a in the second embodiment employs a DPP (discharge produced plasma) system for emitting EUV light by generating discharge between electrodes and turning a target material into plasma.

In the DPP system, there are advantages that the EUV light source apparatus can be downsized, and further, the power consumption of the EUV light source apparatus can be reduced.

The light emitting unit 10a includes a target supply unit 3a, an EUV chamber 4a, a pair of discharge electrodes 9a and 9b, and an EUV collector mirror 15a, and the light emitting unit 10a is connected to the optical path connection module 11.

The target supply unit 3a is a unit for supplying the target material such as xenon (Xe) gas, lithium (Li) vapor, or tin (Sn) vapor between the pair of discharge electrodes 9a and 9b within the EUV chamber 4a.

The EUV chamber 4a is a vacuum chamber in which EUV light is generated.

The pair of discharge electrodes 9a and 9b are provided within the EUV chamber 4a. The pair of discharge electrodes 9a and 9b are connected to a high-voltage pulse generating unit 9c. Alternatively, one of the pair of discharge electrodes 9a and 9b may be connected to the high-voltage pulse generating unit 9c and the other may be grounded. When the high-voltage pulse generating unit 9c generates high-voltage pulses, discharge is generated between the pair of discharge electrodes 9a and 9b. The target material supplied between the pair of discharge electrodes 9a and 9b is excited by the discharge and turned into plasma. From the plasma, light having various wavelengths including EUV light is radiated.

The EUV collector mirror 15a is provided within the EUV chamber 4a. The EUV collector mirror 15a includes plural spheroidal reflection surfaces having different diameters.

The reflection surfaces of the EUV collector mirror 15a are smooth surfaces of a base material such as nickel (Ni) and coated with a metal such as ruthenium (Ru), molybdenum (Mo), or rhodium (Rh), for example. Thereby, the EUV collector mirror 15a can reflect EUV light at an oblique incident angle of 0° to 25° at high reflectance.

The EUV collector mirror 15a is arranged such that the first focuses of the respective spheroids are located at plasma generation sites (PS). The EUV light reflected by the EUV collector mirror 15a is collected to the second focuses of the respective spheroids, i.e., an intermediate focusing point (IF) within the optical path connection module 11. Further, the EUV light passes within the optical path connection module 11 as it becomes broader from the intermediate focusing point and enters projection optics of exposure equipment or another processing unit.

Also in the second embodiment, the same modifications as those in the above-mentioned first to twelfth working examples can be made.

In the second embodiment, since the optical path connection module 11 is provided between the EUV chamber 4a and the processing unit, the specifications of different processing units can be accepted by changing the optical path connection module 11, and thereby, changes in the specifications of the EUV chamber 4a can be reduced. Therefore, the necessity to respectively design and manufacture the EUV chambers 4a in accordance with the changes in the specifications of different processing units can be reduced, and the cost can be reduced.

The invention claimed is:

1. An extreme ultraviolet light source apparatus for supplying extreme ultraviolet light to a processing unit for performing processing by using the extreme ultraviolet light, said apparatus comprising:
    a chamber in which the extreme ultraviolet light to be supplied to said processing unit is generated;
    a collector mirror provided in said chamber, and configured to collect the extreme ultraviolet light generated in said chamber and to output the extreme ultraviolet light from said chamber; and
    an optical path connection module arranged at a position between said chamber and said processing unit, and configured to be detachable from the position by detaching said chamber from said processing unit, to isolate a route of the extreme ultraviolet light between said chamber and said processing unit from outside, and to form, in the optical path connection module, an intermediate focusing point of the extreme ultraviolet light from said chamber, wherein
    said optical path connection module includes a wave-shaped section formed on an inner wall of said optical path connection module.

2. An extreme ultraviolet light source apparatus according to claim 1, further comprising:
    a first gate valve being provided in a connecting part of said chamber to said optical path connection module.

3. An extreme ultraviolet light source apparatus according to claim 1, further comprising:
    a second gate valve being provided in a connecting part of said processing unit to said optical path connection module.

4. An extreme ultraviolet light source apparatus according to claim 1, further comprising:
    a third gate valve being provided at one end of said optical path connection module to be connected to said chamber.

5. An extreme ultraviolet light source apparatus according to claim 1, further comprising:
    a fourth gate valve being provided at one end of said optical path connection module to be connected to said processing unit.

* * * * *